United States Patent [19]

Blanchard

[11] Patent Number: 5,589,415
[45] Date of Patent: Dec. 31, 1996

[54] METHOD FOR FORMING A SEMICONDUCTOR STRUCTURE WITH SELF-ALIGNED CONTACTS

[75] Inventor: Richard A. Blanchard, Los Altos, Calif.

[73] Assignee: SGS-Thomson Microelectronics, Inc., Carrollton, Tex.

[21] Appl. No.: 472,336

[22] Filed: Jun. 7, 1995

[51] Int. Cl.⁶ ................................... H01L 21/70
[52] U.S. Cl. ................. 437/57; 437/34; 437/49; 437/51; 437/40; 437/41; 437/192; 437/193; 437/200
[58] Field of Search .................. 437/34, 51, 52, 437/56, 57, 48, 49, 46, 40 AS, 41 AS, 192, 193, 200

[56] References Cited

U.S. PATENT DOCUMENTS

| | | |
|---|---|---|
| 3,673,471 | 6/1972 | Klein et al. |
| 4,450,470 | 5/1984 | Shiba. |
| 4,470,852 | 9/1984 | Ellsworth ................................ 437/34 |
| 4,498,223 | 2/1985 | Goldman et al. ...................... 437/34 |
| 4,559,694 | 12/1985 | Yoh et al. ......................... 148/DIG. 53 |
| 4,740,479 | 4/1988 | Noppl et al. ............................ 437/34 |
| 4,785,341 | 11/1988 | Ning et al. |
| 4,985,746 | 1/1991 | Asahina. |
| 5,418,179 | 5/1995 | Hotta ...................................... 437/56 |
| 5,478,771 | 12/1995 | Chan et al. ............................. 437/57 |

OTHER PUBLICATIONS

Lu, et al., "High–Performance Salicide Shallow–Junction CMOS Devices for submicrometer VLSI Application in Twin–Tub VI," IEEE Transactions on Electron Devices, vol. 36, No. 11, Nov. 1989.

Pfiester, et al., "A Cobalt Salicide CMOS Process with TiN–Strapped Polysilicon Gates," IEEE Electron Device Letters, vol. 12, No. 6, Jun. 1991.

Pfiester, et al., "A TiN Strapped Polysilicon Gate Cobalt Salicide CMOS Process," IEDM, p. 242 (1990).

Tang, et al., "Titanium Nitride Local Interconnect Technology for VLSI," IEEE Transactions on Electron Devices, vol. ED–24, No. 3 (1987).

Primary Examiner—Tuan H. Nguyen
Attorney, Agent, or Firm—Theodore E. Galanthay; Robert Groover; Lisa K. Jorgenson

[57] ABSTRACT

Local interconnect structures and processes using dual-doped polysilicon. A single implant dopes part of the polysilicon local interconnect layer p-type, and also diffuses through the polysilicon interconnect layer to enhance the doping of the PMOS drain regions, and also (optionally) adds to the doping of the PMOS source regions to provide source/drain asymmetry. The polysilicon interconnect layer is clad to reduce its conductivity, optionally with patterned rather than global cladding so that the diode can be used as a load element if desired.

16 Claims, 7 Drawing Sheets

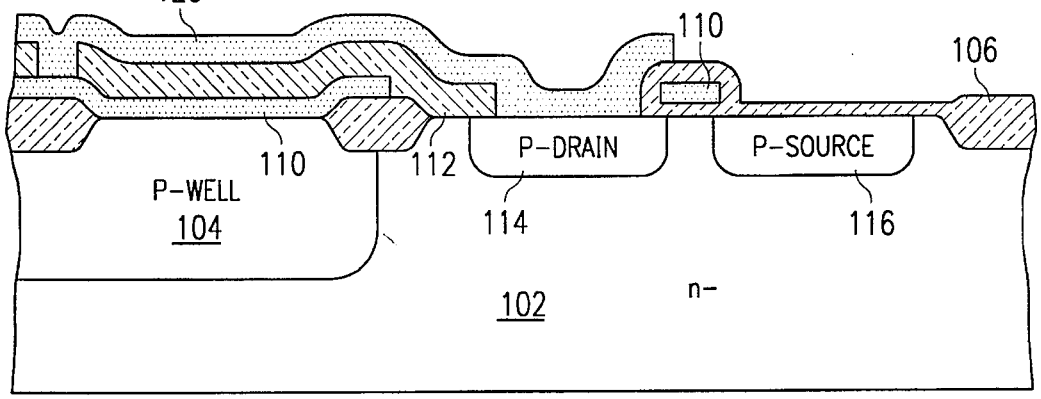
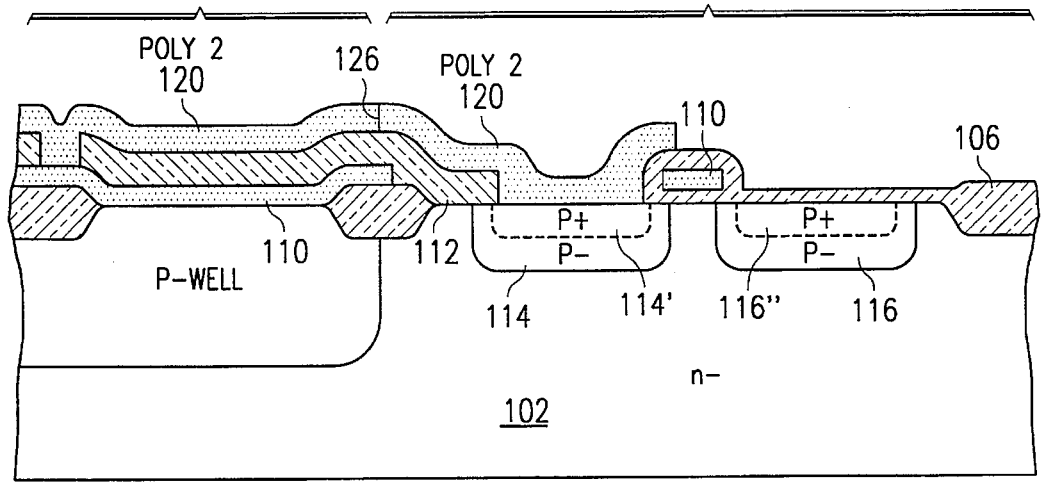
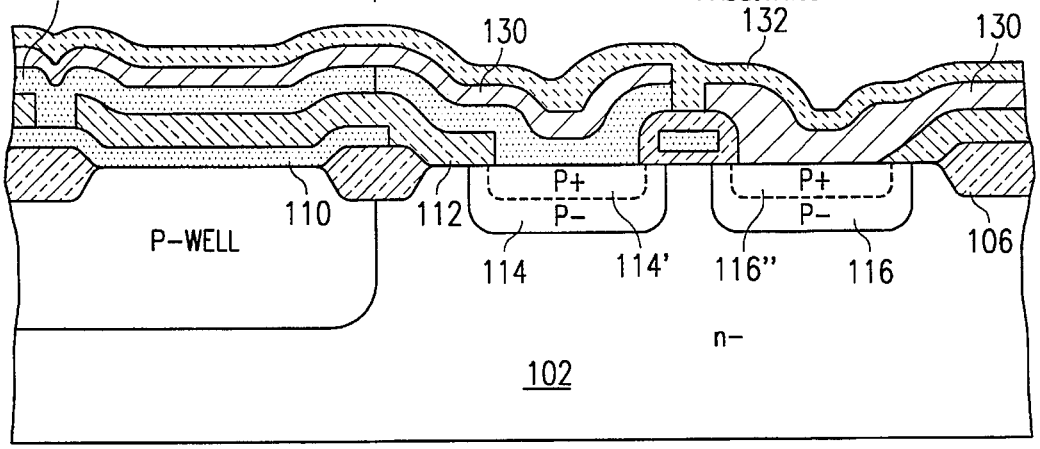

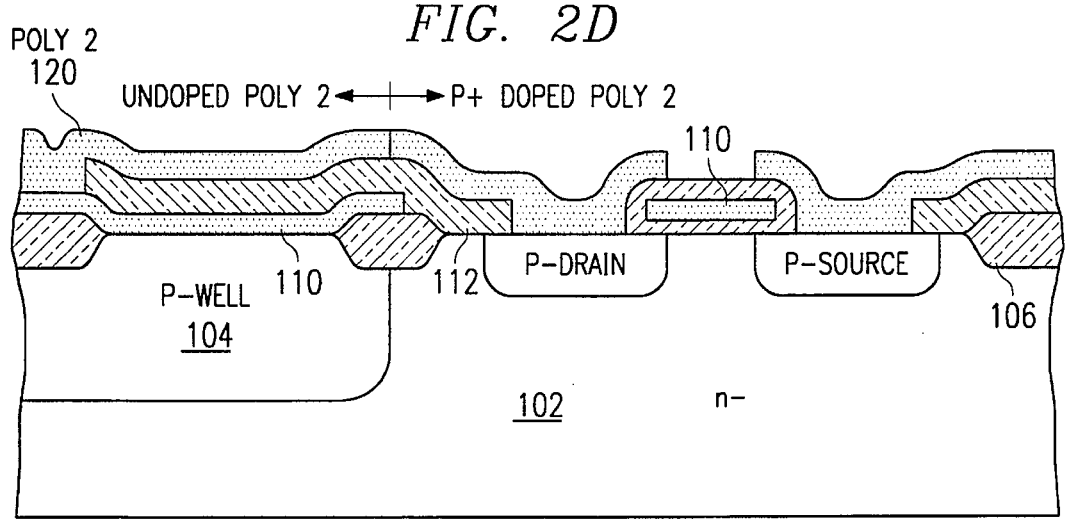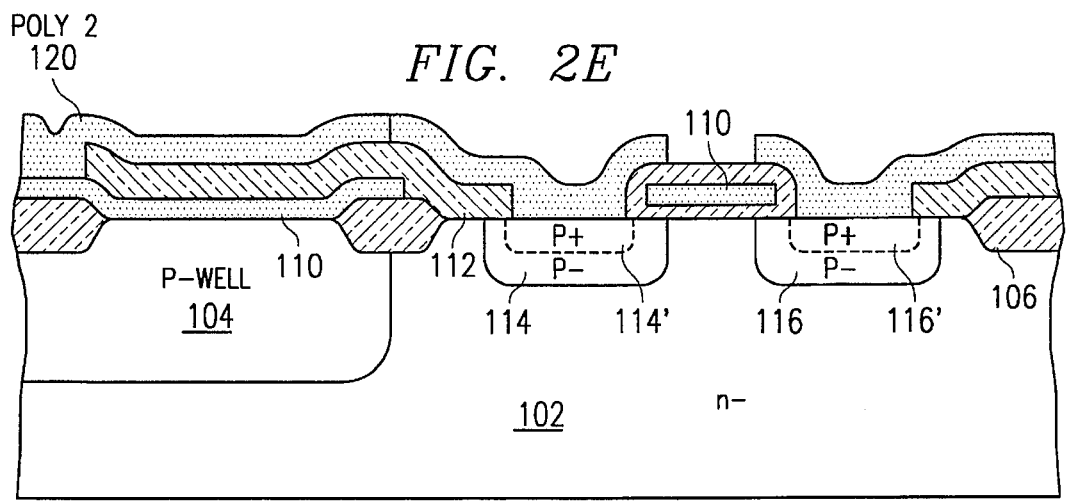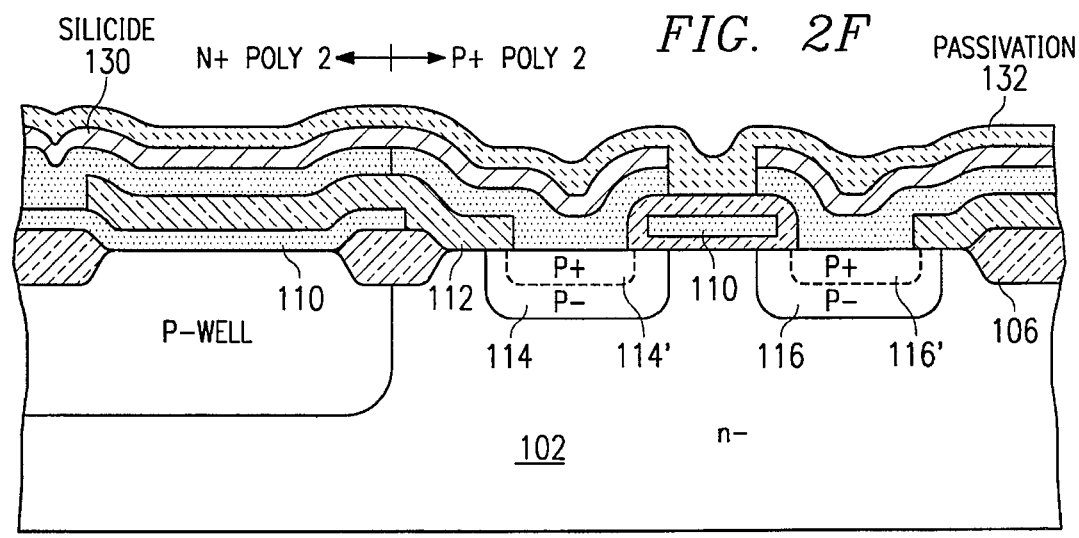

METHOD FOR FORMING A SEMICONDUCTOR STRUCTURE WITH SELF-ALIGNED CONTACTS

BACKGROUND AND SUMMARY OF THE INVENTION

The present application relates to device structures and fabrication processes for high-density integrated circuits.

In integrated circuit device structures, it is often convenient to use polysilicon to form local interconnects. This is particularly attractive in SRAM cells, where the cross-coupled inverters require at least two gate-to-drain connections: if these connections can be implemented without using metal, layout is simplified.

In CMOS devices, one of the limitations on this is that diffusion between n+ and p+ regions may cause counter-doping (where p-type and n-type dopant contributions offset each other). Counterdoping may cause increased resistance (since the effective doping will become lower), and may even cause changes in the device threshold voltage if the counterdoping affects the polysilicon doping over a transistor channel.

If polysilicon is doped n+ (as is most common), then a direct connection between polysilicon and a PMOS drain region will form a diode, which will be inherently susceptible to counterdoping effects.

One approach to this is to interpose a diffusion barrier (e.g. TiN) between the polysilicon and the p+ drain regions. However, this is not possible in all processes.

A further complication is dopant diffusion through silicides: common dopants may diffuse very rapidly in commonly used silicides. Silicides are often used to strap polysilicon layers, but lateral diffusion through the silicide increases the counterdoping problems.

Many papers have proposed use of polysilicon with two doping types: n+ polysilicon provides the gates of NMOS devices, and p+ polysilicon provides the gates of PMOS devices. Junctions between n+ and p+ may be avoided (by resorting to metal jumpers to make connection), or may be shunted by metal or silicide strapping. See e.g. U.S. Pat. Nos. 4,985,746 to Asahina and 3,673,471 to Klein et al.

Commonly-owned U.S. Pat. No. 5,478,771 which is hereby incorporated by reference, disclosed a process using polysilicon for local interconnect, wherein masked implantation of the second polysilicon layer is used to assure that p+/n+ junctions are located as lateral junctions in the second polysilicon layer rather than at the contact to PMOS source/drain regions. Silicide cladding is then applied to short out these lateral junctions.

The present application provides new local interconnect structures and processes using dual-doped polysilicon. A single implant dopes part of the polysilicon local interconnect layer p-type, and also diffuses through the polysilicon interconnect layer to enhance the doping of the PMOS drain regions, and also (optionally) adds to the doping of the PMOS source regions to provide source/drain asymmetry.

The polysilicon interconnect layer is clad to reduce its conductivity, e.g. by being salicided. Optionally, the cladding which shunts the lateral polysilicon junction is patterned rather than global, so that the diode can be used as a load element if desired.

BRIEF DESCRIPTION OF THE DRAWING

The disclosed inventions will be described with reference to the accompanying drawings, which show important sample embodiments of the invention and which are incorporated in the specification hereof by reference, wherein:

FIGS. 1A–1F show fabrication steps in a first innovative embodiment.

FIGS. 2A–2F show fabrication steps in a second innovative embodiment.

DETAILED DESCRIPTION OF THE PREFERRED EMBODIMENTS

The numerous innovative teachings of the present application will be described with particular reference to the presently preferred embodiment (by way of example, and not of limitation), in which:

Primary Embodiment

FIGS. 1A–1F show fabrication steps in a first innovative embodiment.

Figure 1A:
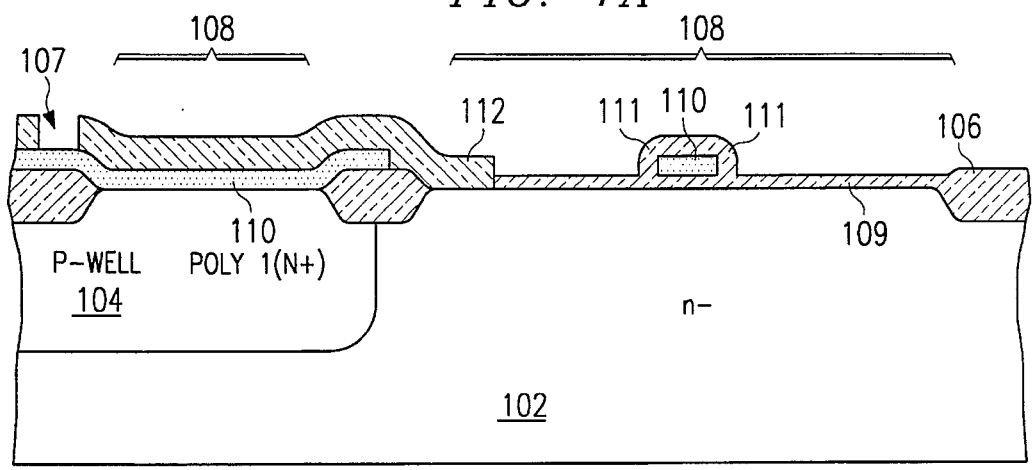

FIG. 1A shows a structure after conventional initial processing steps. An n- substrate 102 has P-well regions 104 diffused into it, and a patterned field oxide 106 provides isolation separating the various active areas 108. A first patterned polysilicon layer 110 runs across the active areas 108 and field oxide 106, and provides transistor gates wherever it crosses an active area. (Sidewall spacers 111, which may be silicon dioxide or silicon nitride, are preferably formed on the first poly layer 110 as shown.) An interpoly dielectric 112 (e.g. a conventional deposited oxide or ONO dielectric) is then deposited and patterned. Note that the patterning removes dielectric 112 from locations 107 where poly-to-poly contacts will be located, as well as from PMOS source/drain locations. Also note that a relatively thin grown oxide 109 remains at the silicon surface in locations where PMOS devices will be formed. This completes fabrication of the intermediate structure of FIG. 1A.

Doping of PMOS source and drain regions is now begun using ion implantation and drive-in, e.g. with a dose of $5\times10^{13}$–$5\times10^{14}$ cm$^{-2}$ and energy which produces P-type drain regions 114 and source regions 116 with an eventual junction depth of e.g. 0.3–1.5 μm. This completes fabrication of the intermediate structure of FIG. 1B.

The oxide 109 is then removed from PMOS drain regions 114 (but not from the source regions 116), preferably using an etch which is at least partially self-aligned. (Thus the sidewall spacers 111, as well as the top surface of the interpoly dielectric 112, are preferably formed of silicon nitride, to permit selective oxide etching.) This completes fabrication of the intermediate structure of FIG. 1C.

A second layer of polysilicon 120 is now deposited, in a substantially intrinsic (or at most lightly doped) condition, with a thickness of e.g. 3000 Å, and patterned to form desired connections, e.g. from poly-to-poly contacts 107 to PMOS drains 114. This completes fabrication of the intermediate structure of FIG. 1D.

A mask is now used to implant a heavy dose of p-type dopants into areas 122. This includes PMOS source and drain regions, and portions of the second polysilicon layer 120 which are adjacent to PMOS source or drain regions. In the figures the entire right side of the illustrated section (to the right of the lateral junction 126) is part of such an area 122. This implant produces p-type polysilicon 120P in the areas of poly 120 which lie within the areas 122. This implant is preferably boron, implanted e.g. with $BF_2$ at an areal density of $5\times10^{14}$–$5\times10^{15}$ cm$^{-2}$ and an energy of 50–200 keV (or alternatively with boron at an energy of 30–100 keV). (Note that this energy is selected to penetrate the oxide 109 over the drain regions 116.) (Alternatively, the oxide 109 may be stripped before this implant. This is easier if the sidewall spacers 111 are nitride.)

A diffusion step is now performed (e.g. by a rapid thermal anneal step to a peak temperature of 800°–1000° C. for 60–900 seconds). This diffusion step performs three functions:

1) it dopes (and activates the doping in) the p-type polysilicon 120P;

2) it adds additional dopant 116" to the PMOS source regions 116; and 3) it adds additional dopant 114' to the PMOS drain regions 114.

Note that effects 2 and 3 provide an asymmetrical LDD structure in the PMOS devices. In particular, the density (atoms per unit area) of the added dopant concentration 116" in the PMOS source regions is much heavier than that of the added dopant concentration 114' in the PMOS drain regions 114. This is advantageous for several reasons:

1) The source regions will have a lower sheet resistance, and hence are useful for Vss and signal routing.

2) The added dopant concentration 114' in the PMOS drain regions will be sufficient to provide a reasonably low specific contact resistance (ohm-cm$^2$).

3) The wider p- extent on the drain side provides reduced parasitic capacitance on drain diffusions.

4) The wider p- extent on the drain side provides protection against hot hole generation, if dimensions and operating voltages are such that hot holes are a concern.

5) The wider p- extent on the drain side provides slightly improved junction leakage.

6) The wider p- extent on the drain side provides better immunity to breakdown under transient overvoltages.

7) The wider p- extent on the drain side provides reduced emitter efficiency, and some added series resistance, in the PNP component of the parasitic thyristor, and hence provides some added immunity to latchup.

This completes fabrication of the intermediate structure of FIG. 1E.

N-type dopants are now implanted into regions 124, to form N-type polysilicon 120N in those areas (and define the lateral junction 126 between N-type poly 120N and P-type poly 120P).

The surface of the polysilicon is now clad with a conductive layer 130. This can be done in several ways.

1) Preferably the conductive layer is simply deposited and patterned, e.g. as 500 Å CVD W over 200 Å CVD TiN. This requires an additional masking step, but has the advantage that the conductive layer can be selected to provide a diffusion barrier. This in turn reduces the risk of interdiffusion between N-type and P-type polysilicon areas, and reduces constraints on subsequent high-temperature steps. This also facilitates the option, mentioned below, of using a blanket implant to dope the N-type polysilicon 120N. Of course other compositions can be used for the conductive layer 130, e.g. molybdenum or another metal, or tantalum or another silicide, alone or over TiN.

2) Alternatively a salicidation step can be performed at this point, e.g. by depositing Ti overall, briefly heating (RTA) to form titanium silicide on exposed silicon and polysilicon, and stripping the Ti or TiN from dielectric areas.

3) Alternatively and still less preferably, the polysilicon 120 can be initially deposited as a layered structure (e.g. 400 Å TiN over 2000 Å of polysilicon). However, this will require a higher dose and/or energy for the implants which dope the polysilicon, and this must be balanced against the maximum desired depth of the added dopant concentration 116" in the PMOS source regions.

An important advantage of option 1 is that the conductive layer can optionally be omitted over the junction 126. This junction 126 then provides designers with an optional load element which can be used, in combination with a CMOS gate, to reduce the charge consumption during a transition. Since polysilicon diodes tend to be leaky, this junction 126 can also be used to provide a very high-impedance load, e.g. for output latches with added ESD resistance, if desired.

A passivation layer 132 is then deposited over the conductive layer. This completes fabrication of the intermediate structure of FIG. 1F. Processing now concludes with conventional steps, e.g. contact etch, deposition and etch of one or more metal layers, and deposition and etch of a protective overcoat layer.

The foregoing description has concentrated on the interaction between P+ doping of the second polysilicon layer 120 and the PMOS source and drain regions. However, the second polysilicon layer 120 also makes contact to NMOS drain regions, and the same process steps can advantageously provide modified NMOS source and drain doping while the second polysilicon layer 120 is being doped.

First Alternative Embodiment

FIGS. 2A–2F show fabrication steps in a second innovative embodiment. This embodiment is generally quite similar to the first embodiment, except that the PMOS source and drain regions in this embodiment are identical.

Figure 1B:
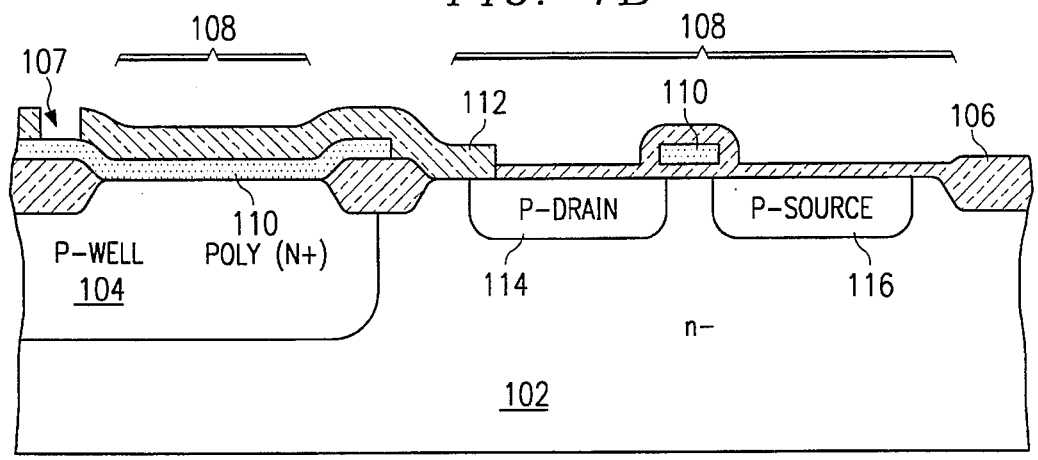
Figure 1C:
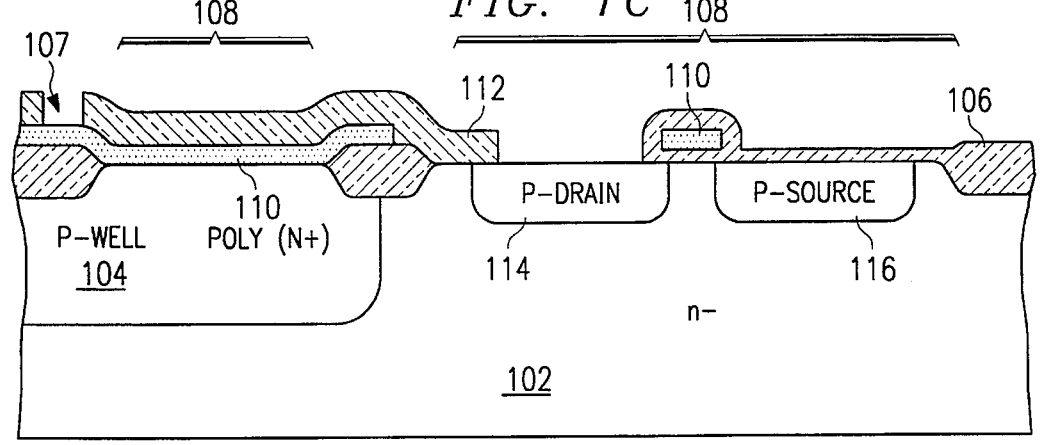
Figure 2A:
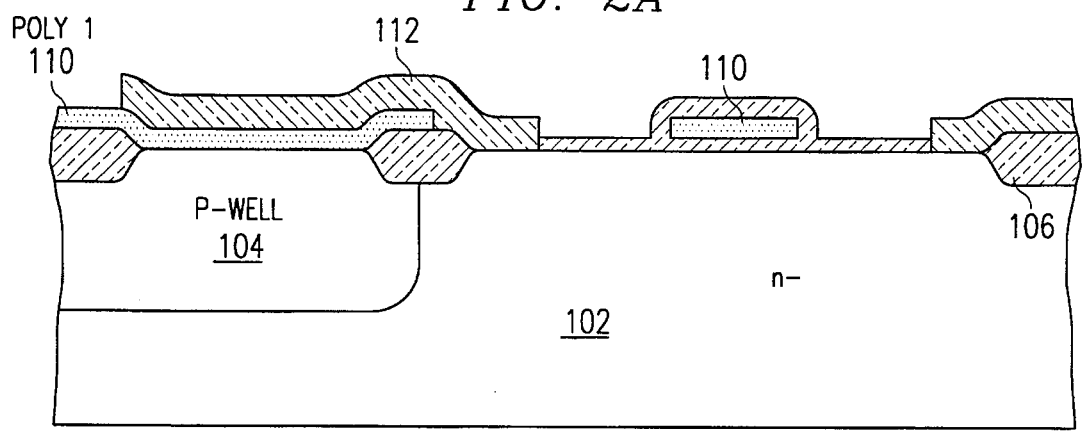
Figure 2B:
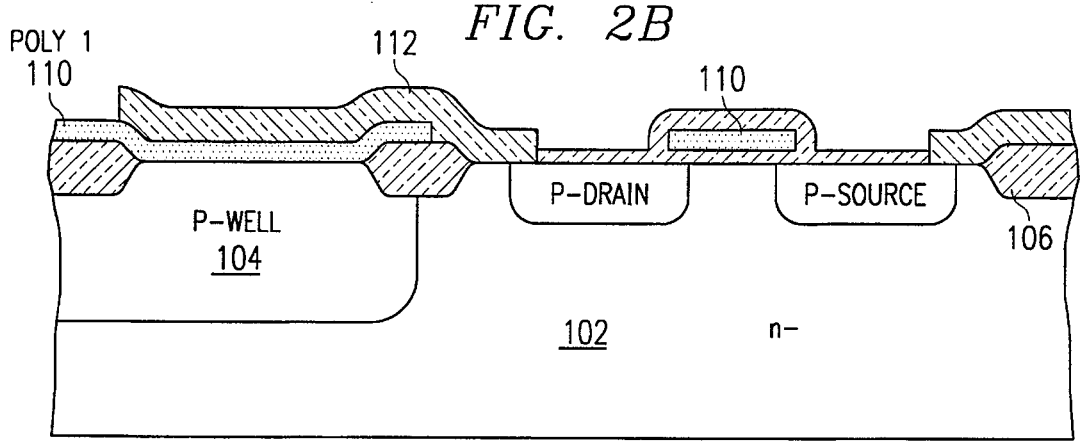
Figure 2C:
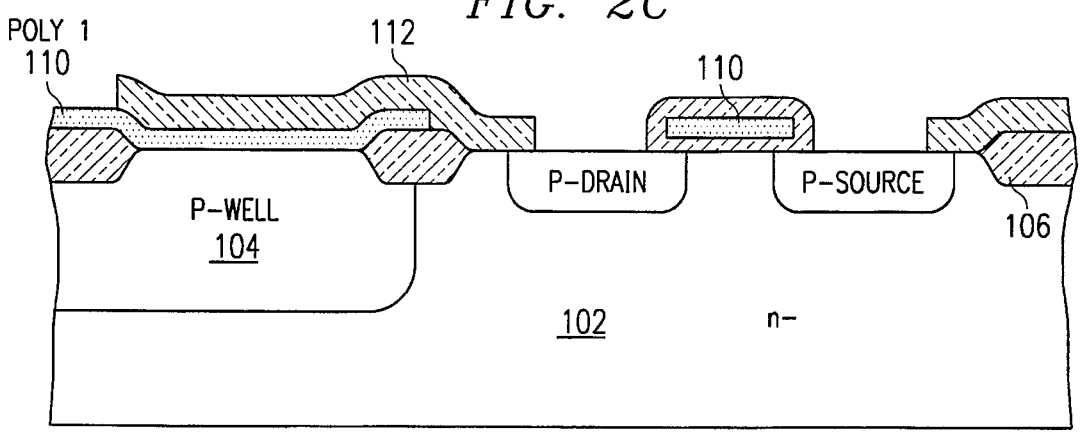

FIGS. 2A–2C are identical to FIGS. 1A–1C, and the processing steps are also identical. However, as seen in FIG. 2D, the second polysilicon layer 120 is not removed from the PMOS source regions when it is etched. As seen in FIG. 2E, the added doping concentration 116' in the PMOS source regions therefore has a profile which is identical to that of the added doping concentration 114' in the PMOS drain regions. As seen in FIG. 2F, the remaining processing steps can be identical to those used in the primary embodiment (and its variations). However, since the conductive layer 130 is not used to contact the PMOS source regions in this embodiments, selection of materials for the conductive layer 130 is somewhat less critical.

The foregoing description has concentrated on the interaction between P+ doping of the second polysilicon layer 120 and the PMOS source and drain regions. However, the second polysilicon layer 120 also makes contact to NMOS drain regions, and the same process steps can advantageously provide modified NMOS source and drain doping while the second polysilicon layer 120 is being doped.

Second Alternative Embodiment

FIGS. 3A–3F show fabrication steps in a third innovative embodiment. This embodiment is somewhat less similar to the first embodiment.

Figure 3A:
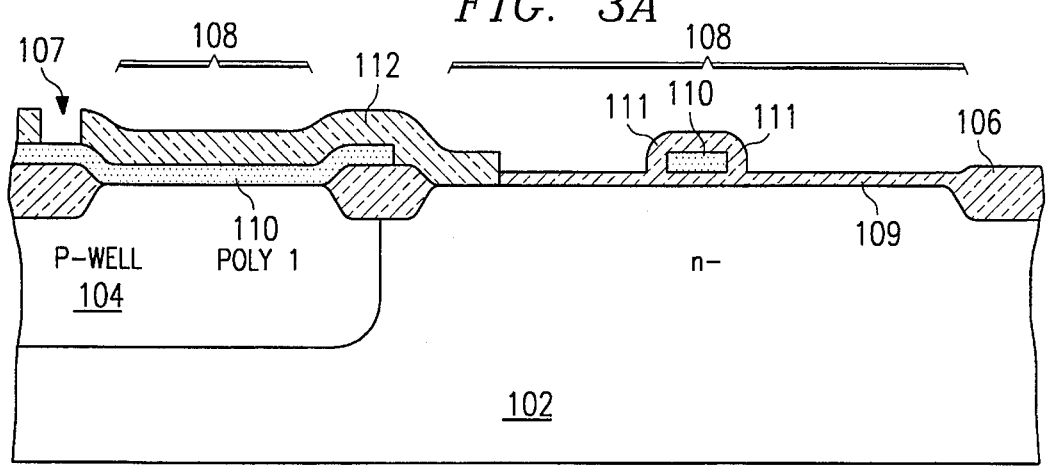
FIGS. 3A–3F show fabrication steps in a third innovative embodiment.
Figure 3B:
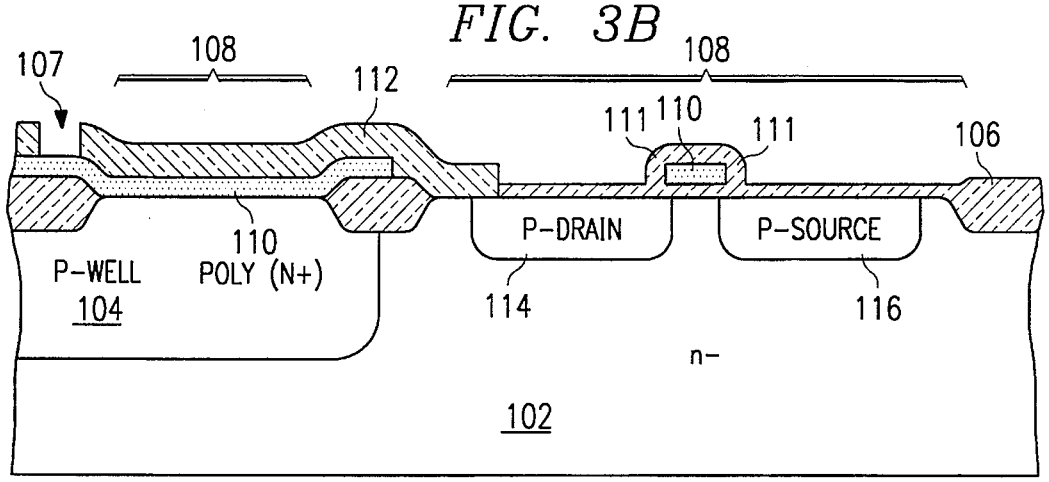
Figure 3C:
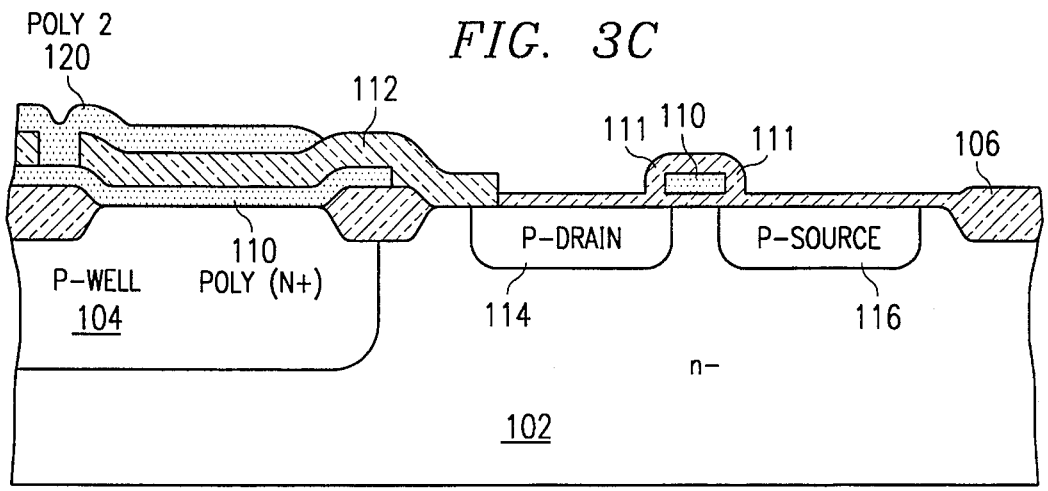
Figure 3D:
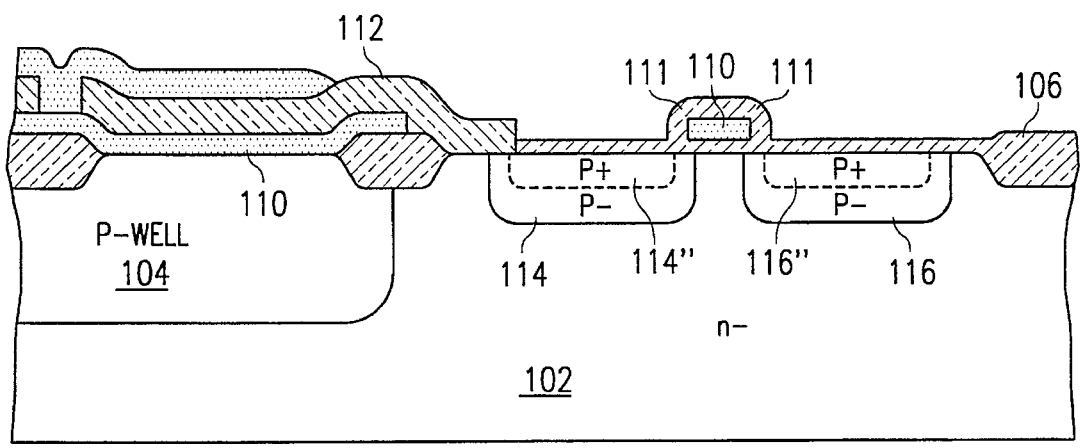
Figure 3E:
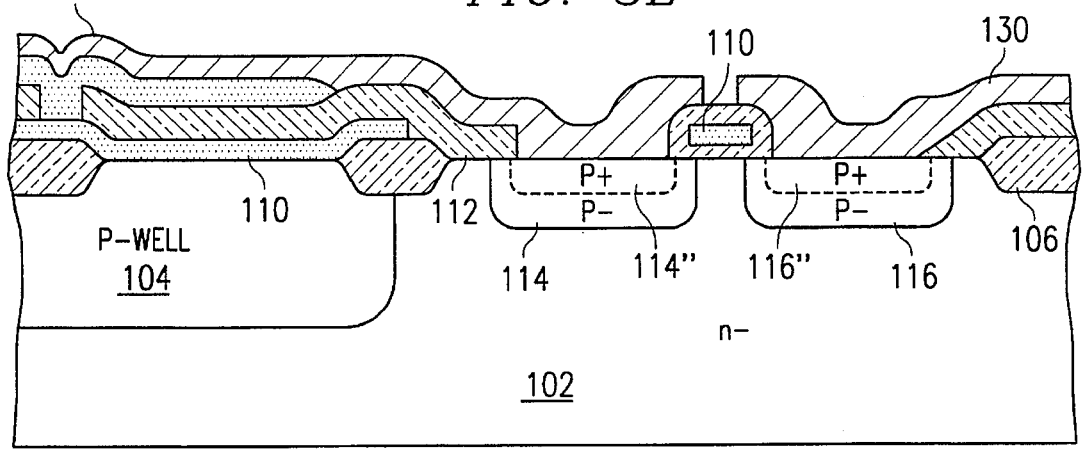

FIGS. 3A–3B are identical to FIGS. 1A–1B, and the processing steps are also identical. However, this embodiment does not use a dual-doped polysilicon layer. Instead, as seen in FIG. 3C, when the second polysilicon layer 120 is etched it is removed from PMOS source and drain regions. This embodiment may be attractive in embodiments where the second polysilicon layer is needed for other reasons, e.g. to provide increased layout density in some parts of the chip.

SRAM Cell

Figure 4:
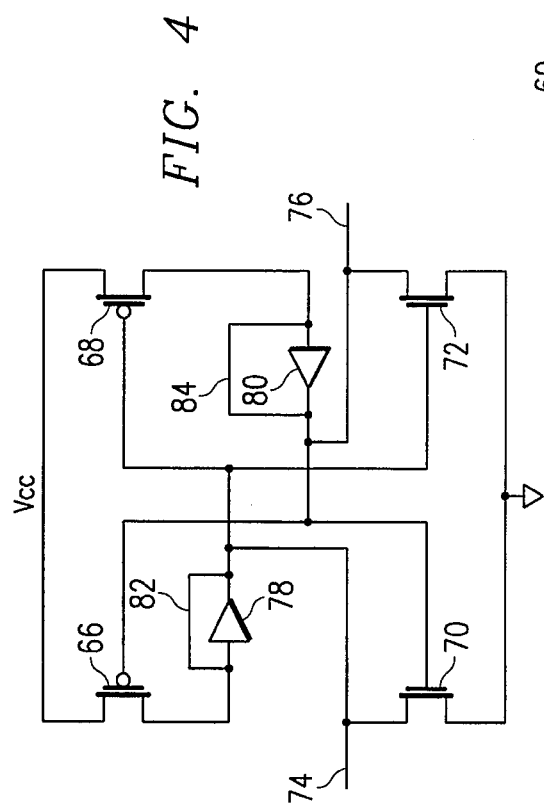
FIG. 4 shows how an SRAM cell core (latch) according to the disclosed innovations can include or omit junction diodes.

FIG. 4 shows how an SRAM cell can include or omit junction diodes (related to the need to connect from N+ to P+), depending on whether strapping is used.

NMOS transistor 70 and PMOS transistor 66 provide one inverter, and NMOS transistor 72 and PMOS transistor 68 provide another inverter. The two inverters are cross-coupled, i.e. the input of either inverter is connected to the output of the other. This provides a positive-feedback relation with two stable states, and hence data storage is possible.

The drain of each PMOS transistor is necessarily P-type, and the drain of each NMOS transistor is necessarily N-type. The gate polysilicon is also normally N-type. Thus it is possible (e.g. if first contacts are used) for a junction 80 to exist between the drain of PMOS 68 and the drain of NMOS 72 (which also provides the first output node 76). Similarly, it is possible for a junction 78 to exist between the drain of PMOS 66 and the drain of NMOS 70 (which also provides the second output node 74). However, the use of ohmic contacts to bridge these junctions, e.g. by using cladding as shown in FIG. 5, shorts out the junctions 76 and 78.

Figure 3F:
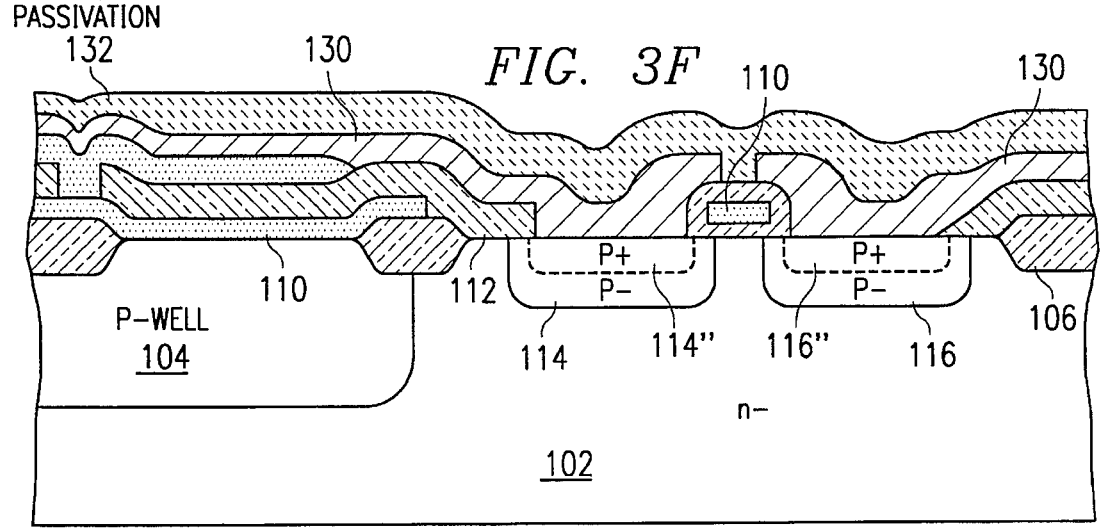
Figure 5:
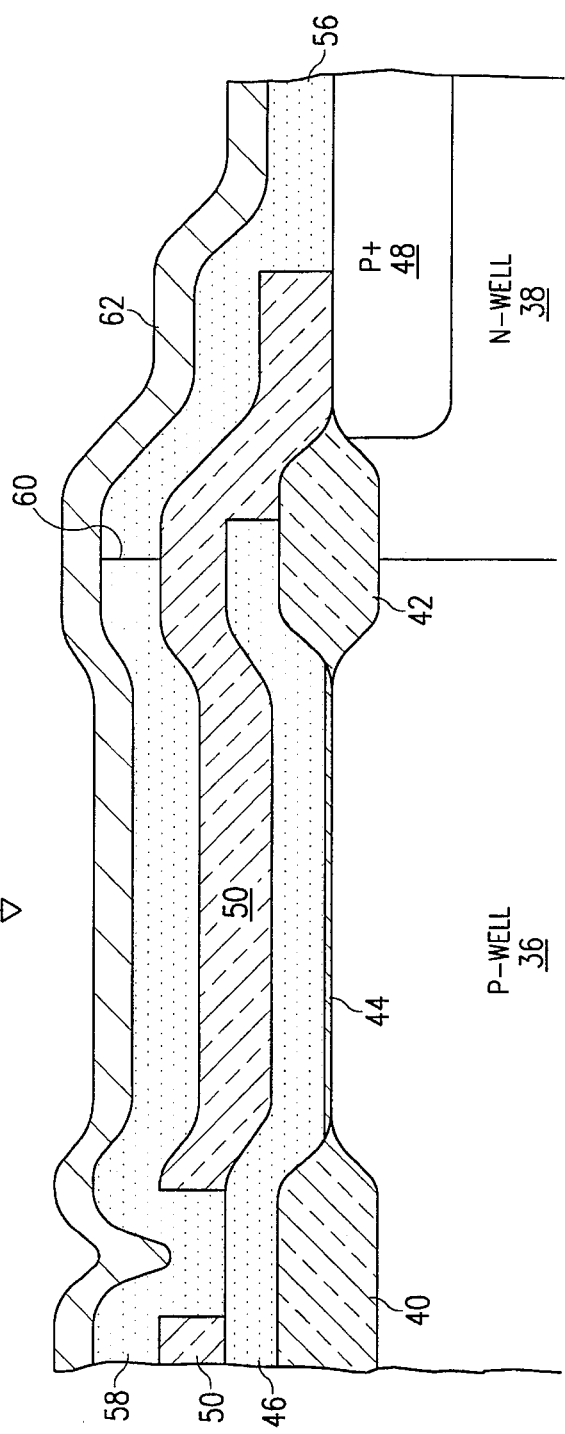
FIG. 5 is a sectional view showing how dual-doped poly interconnects, fabricated according to one of the process sequences ending in FIGS. 1F, 2F, or 3F, permit a junction diode to be optionally avoided when metallic strapping is used.

FIG. 5 is a sectional view showing how dual-doped poly interconnects, fabricated according to one of the process sequences ending in FIGS. 1F, 2F, or 3F, permit a junction diode to be optionally avoided when metallic strapping is used. In the sample structure illustrated a first N-type poly layer 46 provides insulated transistor gates over N-well regions 38 and over P-well regions 36. A second poly layer has N-type regions 58 and P-type regions 56, separated by a lateral junction 60. P-type polysilicon regions 56 make contact to P+ source/drain diffusions, and N-type regions 58 make contact to N+ source/drain diffusions (not shown in this Figure). Cladding 62 makes ohmic contact to both N-type regions 58 and P-type regions 56, and hence shunts the junction 60. As discussed above, the cladding 62 may be a salicide, or may be self-aligned (direct-reacted) TiN, or may be a deposited structure such as W over TiN.

According to a disclosed class of innovative embodiments, there is provided: A fabrication method, comprising the steps of: forming a first patterned thin-film polycrystalline semiconductor layer to provide insulated gates over first and second crystalline semiconductor regions, the second semiconductor region having a first conductivity type and the first semiconductor region having a second conductivity type; forming an interlevel dielectric over the first polycrystalline semiconductor layer; depositing a second polycrystalline semiconductor layer which at least partly overlies the interlevel dielectric, and patterning the second polycrystalline layer to expose at least some portions of the first and second semiconductor regions; doping a first portion of the second polycrystalline layer with first-conductivity-type dopants, and simultaneously doping any exposed portions of the first semiconductor regions; doping a second portion of the second polycrystalline semiconductor layer with second-conductivity-type dopants, and simultaneously doping any exposed portions of the second semiconductor regions; and cladding the second polycrystalline semiconductor layer with a layer of metallic conductivity which shunts at least some of the lateral junctions.

According to another disclosed class of innovative embodiments, there is provided: A fabrication method, comprising the steps of: forming a first patterned thin-film polycrystalline semiconductor layer to provide insulated gates over first and second crystalline semiconductor regions, the second semiconductor region having a first conductivity type and the first semiconductor region having a second conductivity type, and forming preliminary diffusions of the first conductivity type in the first semiconductor region and of the second conductivity type in the second semiconductor region, the preliminary diffusions being at least partly self-aligned to the first layer; forming a patterned interlevel dielectric over the first polycrystalline semiconductor layer; depositing a second polycrystalline semiconductor layer which at least partly overlies the interlevel dielectric, and patterning the second polycrystalline semiconductor layer to expose at least some portions of the first and second semiconductor regions; doping a first portion of the second polycrystalline semiconductor layer with first-conductivity-type dopants, and simultaneously doping any exposed portions of the first semiconductor regions; and doping a second portion of the second polycrystalline semiconductor layer with second-conductivity-type dopants.

According to another disclosed class of innovative embodiments, there is provided: A fabrication method, comprising the steps of: forming a first patterned thin-film polycrystalline semiconductor layer to provide insulated gates over first and second crystalline semiconductor regions; forming an interlevel dielectric over the first polycrystalline semiconductor layer, and patterning the interlevel dielectric layer to expose at least some portions of the first and second semiconductor regions; depositing a second polycrystalline semiconductor layer which at least partly overlies the interlevel dielectric; doping a first portion of the second polycrystalline layer with first-conductivity-type dopants, and diffusing the first-conductivity-type dopants into the first crystalline semiconductor region to form diffusions therein; and doping a second portion of the second polycrystalline semiconductor layer with second-conductivity-type dopants, and diffusing the second-conductivity-type dopants into the second crystalline semiconductor region to form diffusions therein.

According to another disclosed class of innovative embodiments, there is provided: A fabrication method, comprising the steps of: forming a first patterned thin-film polycrystalline semiconductor layer to provide insulated gates over first and second crystalline semiconductor regions; forming a patterned interlevel dielectric over the first polycrystalline semiconductor layer; forming a patterned second polycrystalline semiconductor layer to expose the first semiconductor regions; doping a first portion of the second polycrystalline layer with first-conductivity-type dopants, and simultaneously doping any exposed portions of the first semiconductor regions; and forming an additional patterned layer of metallic conductivity, having a composition different from the second polycrystalline semiconductor layer, to make ohmic connections from the second polycrystalline semiconductor layer to the first semiconductor regions.

According to another disclosed class of innovative embodiments, there is provided: An integrated circuit, comprising: first field-effect transistors having gates thereof formed in a first patterned thin-film polycrystalline semiconductor layer, and having source and drain regions of a first conductivity type; second field-effect transistors having gates thereof formed in the first patterned thin-film polycrystalline semiconductor layer, and having source and drain regions of a second conductivity type; a second patterned thin-film polycrystalline semiconductor layer, including first portions with the first conductivity type, second portions with the second conductivity type, and lateral junctions between the first and second portions; the second polycrystalline semiconductor layer being clad by a layer of metallic conductivity which shunts at least some of the lateral junctions; at least one the transistor having a dopant profile in the source region thereof which is different from the dopant profile in the drain region thereof.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

For example, two masked implants are preferably used to implant the dual-doped polysilicon layer, but alternatively and less preferably counterdoping can be used here to save a mask (i.e. one implant is performed as a blanket implant).

For another example, the N-type and P-type poly regions do not have to be fully complementary patterns; some of the second polysilicon can be left intrinsic if desired, to provide high-resistivity material for resistors or loads.

For another example, the present invention can be applied to fabrication of the N-channel devices in addition to or instead of the application to P-channel devices which is discussed in detail above. The process steps describe above can then provide LDD asymmetry between NMOS source and drain, which is useful for optimal hot-carrier control with maximum drive capability.

For another example, the strapping between the N-type and P-type polysilicon regions can use various known materials, such as TiN or TiW, in addition to the use of a silicide.

For another example, the fabrication steps discussed above can optionally be performed selectively, in the periphery and not in the memory array of a memory chip.

What is claimed is:

1. An integrated circuit fabrication method, comprising the steps of:
   (a.) forming a first patterned thin-film polycrystalline semiconductor layer to provide insulated gates over first and second crystalline semiconductor regions, said second crystalline semiconductor region having a first conductivity type and said first crystalline semiconductor region having a second conductivity type;
   (b.) forming an interlevel dielectric over said first patterned thin film polycrystalline semiconductor layer;
   (c.) depositing a second polycrystalline semiconductor layer which at least partly overlies said interlevel dielectric, and patterning said second polycrystalline semiconductor layer to expose first portions, but not second portions, of said first and second crystalline semiconductor regions;
   (d.) doping a first portion of said second polycrystalline semiconductor layer with first-conductivity-type dopants, and simultaneously doping any exposed portions of said first crystalline semiconductor regions;
   (e.) doping a second portion of said second polycrystalline semiconductor layer with second-conductivity-type dopants, and simultaneously doping said first portions of said second crystalline semiconductor regions; and
   (f.) cladding said second polycrystalline semiconductor layer with a cladding layer of metallic conductivity which shunts at least some of the lateral junctions between said first and second portions of said second polycrystalline layer;
   whereby said steps c), d), and e) create an asymmetrical source/drain structure.

2. The method of claim 1, further comprising a preliminary step of forming dielectric sidewall spacers on said first patterned thin-film polycrystalline layer.

3. The method of claim 1, wherein said first and second crystalline semiconductor regions consist essentially of silicon.

4. The method of claim 1, wherein said cladding layer comprises a metal silicide.

5. The method of claim 1, wherein said cladding layer comprises a diffusion-barrier material.

6. The method of claim 1, wherein said first patterned thin-film polycrystalline semiconductor layer is doped with said first conductivity type.

7. The method of claim 1, wherein said first patterned thin-film polycrystalline semiconductor layer consists essentially of polysilicon.

8. The method of claim 1, wherein said first portions of said first and second semiconductor regions are source locations, and said second portions of said first and second semiconductor regions are drain locations.

9. An integrated circuit fabrication method, comprising the steps of:
   (a.) forming a first patterned thin-film polycrystalline semiconductor layer to provide insulated gates over first and second crystalline semiconductor regions, said second crystalline semiconductor region having a first conductivity type and said first crystalline semiconductor region having a second conductivity type, and forming preliminary diffusions of said first conductivity type in said first crystalline semiconductor region and of said second conductivity type in said second crystal line semiconductor region, said preliminary diffusions being at least partly self-aligned to said first patterned thin-film polycrystalline semiconductor layer;
   (b.) forming a patterned interlevel dielectric over said first patterned thin-film polycrystalline semiconductor layer;
   (c.) depositing a second polycrystalline semiconductor layer which at least partly overlies said interlevel dielectric, and patterning said second polycrystalline semiconductor layer to expose first portions, but not second portions, of said first and second crystalline semiconductor regions;
   (d.) doping a first portion of said second polycrystalline semiconductor layer with first-conductivity-type dopants, and simultaneously doping said first portions of said first crystalline semiconductor regions; and
   (e.) doping a second portion of said second polycrystalline semiconductor layer with second-conductivity-type dopants;
   whereby said steps c), d), and e) create an asymmetrical source/drain structure.

10. The method of claim 9, further comprising the subsequent step of
    (f.) cladding said second polycrystalline semiconductor layer with a layer of metallic conductivity which shunts at least some lateral PN junctions therein.

11. The method of claim 9, wherein said doping step (e.) also simultaneously dopes any exposed portions of said second crystalline semiconductor regions.

12. The method of claim 9, further comprising a preliminary step of forming dielectric sidewall spacers on said first patterned thin-film polycrystalline layer.

13. The method of claim 9, wherein said first and second crystalline semiconductor regions consist essentially of silicon.

14. The method of claim 9, wherein said first patterned thin-film polycrystalline semiconductor layer is doped with said first conductivity type.

15. The method of claim 9, wherein said first patterned thin-film polycrystalline semiconductor layer consists essentially of polysilicon.

16. The method of claim 9, wherein said first portions of said first and second semiconductor regions are source locations, and said second portions of said first and second semiconductor regions are drain locations.

* * * * *